United States Patent
Lee et al.

(10) Patent No.: US 11,943,961 B2
(45) Date of Patent: Mar. 26, 2024

(54) ELECTRONIC DEVICE

(71) Applicant: Samsung Display Co., Ltd., Yongin-Si (KR)

(72) Inventors: Cheonmyeong Lee, Seoul (KR); Youngchan Kim, Seoul (KR); Byungchoon Yang, Seoul (KR); Jaeho You, Gwangmyeong-si (KR); Jiwon Lee, Suwon-si (KR); Joo Woan Cho, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 544 days.

(21) Appl. No.: 16/937,737

(22) Filed: Jul. 24, 2020

(65) Prior Publication Data

US 2021/0111378 A1   Apr. 15, 2021

(30) Foreign Application Priority Data

Oct. 15, 2019   (KR) .................... 10-2019-0127991

(51) Int. Cl.
| | |
|---|---|
| *H10K 50/85* | (2023.01) |
| *G03B 21/14* | (2006.01) |
| *G03B 21/56* | (2006.01) |
| *G03B 21/62* | (2014.01) |
| *H04N 9/31* | (2006.01) |
| *H10K 50/854* | (2023.01) |
| *H10K 50/858* | (2023.01) |
| *H10K 50/86* | (2023.01) |
| *H10K 59/30* | (2023.01) |

(52) U.S. Cl.
CPC ......... *H10K 50/858* (2023.02); *H10K 50/854* (2023.02); *H10K 50/865* (2023.02); *H10K 59/30* (2023.02)

(58) Field of Classification Search
CPC ............ H01L 27/3206; H01L 51/5275; H01L 51/5268; H01L 51/5284; H10K 50/858; H10K 50/854; H10K 50/865; G03B 21/142; G03B 21/62; G03B 21/567
See application file for complete search history.

(56) References Cited

U.S. PATENT DOCUMENTS 7,428,100 B2 *   9/2008   Smith .................. G02F 1/292
                                                  359/566
10,133,083 B1    11/2018  Ziemkiewicz et al.
(Continued)

FOREIGN PATENT DOCUMENTS

KR         101496505 B1      3/2015
KR      1020160131919 A     11/2016
(Continued)

*Primary Examiner* — Omar F Mojaddedi
(74) *Attorney, Agent, or Firm* — CANTOR COLBURN LLP (57) ABSTRACT

An electronic device includes a display panel, a first optical part, and a second optical part including a diffraction optical element having a diffraction grating. The display panel include a first display area for displaying a first image having a first color, a second display area disposed adjacent to the first display area to display a second image having a second color different from the first color, and a third display area disposed adjacent to the second display area to display a third image having a third color different from the first color and the second color.

20 Claims, 8 Drawing Sheets

(56) References Cited

U.S. PATENT DOCUMENTS

| | | | |
|---|---|---|---|
| 2012/0026489 A1* | 2/2012 | Zhao | G01N 21/8806 |
| | | | 356/237.2 |
| 2016/0064694 A1* | 3/2016 | Choi | H10K 50/865 |
| | | | 257/40 |
| 2016/0327853 A1 | 11/2016 | Sarma et al. | |
| 2018/0120669 A1* | 5/2018 | Popovich | H01L 27/14625 |
| 2018/0149794 A1* | 5/2018 | Oh | G02B 6/0061 |
| 2019/0079218 A1 | 3/2019 | Lee et al. | |
| 2019/0310462 A1* | 10/2019 | Yoshimura | G02B 27/0101 |
| 2022/0179197 A1* | 6/2022 | Sato | G02F 1/29 |

FOREIGN PATENT DOCUMENTS

| | | |
|---|---|---|
| KR | 101900085 B1 | 9/2018 |
| KR | 101928135 B1 | 12/2018 |
| KR | 1020190028130 A | 3/2019 |

\* cited by examiner

ELECTRONIC DEVICE

This application claims priority to Korean Patent Application No. 10-2019-0127991, filed on Oct. 15, 2019, and all the benefits accruing therefrom under 35 U.S.C. § 119, the content of which in its entirety is herein incorporated by reference.

BACKGROUND

1. Field

The disclosure herein relates to an electronic device having a reduced size.

2. Description of the Related Art

Generally, a projector-type electronic device may operate in a way, for example, such that light emitted from a light source is separated into first to third light through a prism, the separated first to third light is converted into first to third images by a digital micromirror device ("DMD"), respectively, and the first to third images are synthesized into one image by the prism and then transmitted through a lens. As the transmitted image is expanded and projected to an external screen, a large screen may be realized.

SUMMARY

A projector-type electronic device may have an advantage of having a high ratio of a screen to a price. However, in such an electronic device, an optical part such as the prism and the lens has a relatively large size, thereby occupying much space. Thus, the electronic device may increase in size. The disclosure is directed to an electronic device having a reduced size.

An embodiment of the invention provides an electronic device including: a display panel; a first optical part disposed on the display panel; and a second optical part disposed on the first optical part and including a diffraction optical element having a diffraction grating. In such an embodiment, the display panel includes: a first display area which displays a first image having a first color; a second display area disposed adjacent to the first display area and which displays a second image having a second color different from the first color; and a third display area disposed adjacent to the second display area and which displays a third image having a third color different from the first color and the second color.

In an embodiment, the second optical part may include a first area, a second area, and a third area, and the first area may be disposed on the first display area, the second area may be disposed on the second display area, and the third area may be disposed on the third display area.

In an embodiment, the diffraction grating may have a pitch that is different in each of the first area, the second area, and the third area.

In an embodiment, the first optical part may include: a first lens disposed between the display panel and the second optical part; and a second lens disposed between the first lens and the second optical part.

In an embodiment, the first optical part may change a path and a luminance of light provided from the display panel.

In an embodiment, light incident from the first optical part to the second optical part may be parallel light.

In an embodiment, the electronic device may further include a light shielding part disposed above the second optical part.

In an embodiment, the first image, the second image and the third image, which are transmitted through the second optical part, may be combined into a single image.

In an embodiment, the first display area, the second display area and the third display area may not overlap each other when viewed on a plane.

In an embodiment, the first color may be a red color, the second color may be a green color, and the third color may be a blue color.

In an embodiment, the first image may have only the first color, the second image may have only the second color, and the third image may have only the third color.

In an embodiment, the first image, the second image, and the third image may be different from each other only in color.

In an embodiment, the electronic device may further include a screen at which the first image, the second image, and the third image are combined into a single image.

In an embodiment, the electronic device may further include: a first diffraction element disposed on a surface of the screen; a second diffraction element disposed on the first diffraction element; and a third diffraction element disposed on the second diffraction element.

In an embodiment, the first diffraction element may reflect the first image in a predetermined direction, the second diffraction element may reflect the second image in the predetermined direction, and the third diffraction element may reflect the third image in the predetermined direction.

In an embodiment, the electronic device may further include a scattering element disposed on one surface of the screen.

In an embodiment, the electronic device may further include a first lens part disposed on a surface of the screen, and the screen may be transparent.

In an embodiment, the first lens part may reflect the first image, the second image, and the third image and transmit light incident to the screen.

In an embodiment, the electronic device may further include a second lens part disposed on a surface of the screen. In such an embodiment, each of the first image, the second image and the third image may include a left eye image and a right eye image, and the second lens part may refract each of the left eye image and the right eye image in a predetermined direction to provide a three-dimensional image.

In an embodiment, the screen may be opaque.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numerals refer to like elements throughout. Also, in the figures, the thickness, ratio, and dimensions of components are exaggerated for clarity of illustration.

It will be understood that when an element is referred to as being "on" another element, it can be directly on the other element or intervening elements may be present therebetween. In contrast, when an element is referred to as being "directly on" another element, there are no intervening elements present.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
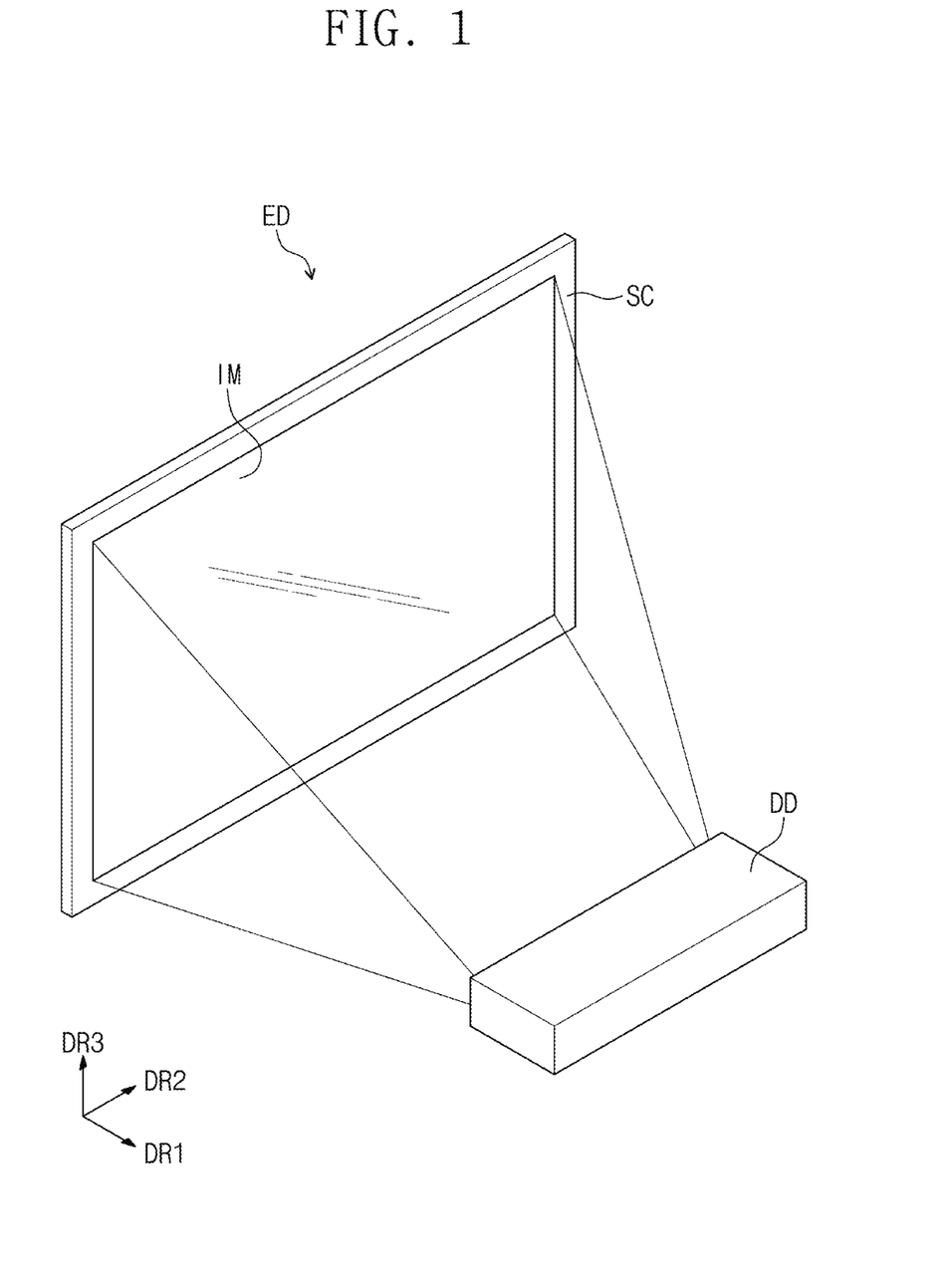
FIG. 1 is a perspective view illustrating an electronic device according to an embodiment of the invention.

FIG. 1 is a perspective view illustrating an electronic device according to an embodiment of the invention.

Referring to FIG. 1, an embodiment of an electronic device ED may include a display device DD and a screen SC.

The display device DD may project an image IM toward the screen SC substantially in a first direction DR1.

The screen SC may be parallel to a plane defined by a second direction DR2 crossing the first direction DR1 and a third direction DR3 crossing the first direction DR1 and the second direction DR2. The first direction DR1, the second direction DR2, and the third direction DR3 may be perpendicular to each other. Herein, a surface defined by the first direction DR1 and the second direction DR2 may be defined as a plane, and an expression "when viewed on a plane" may mean "when viewed from a plan view in the third direction DR3". The third direction DR3 may be a thickness direction of the display device DD.

In an embodiment, as shown in FIG. 1, the screen SC may have a thin rectangular plate shape, but the embodiment of the invention is not limited thereto. In one alternative embodiment, for example, the screen SC may be a curved screen, which is curved inside or outside, or a wall surface.

In an alternative embodiment, the electronic device ED may not include the screen SC.

Figure 2:
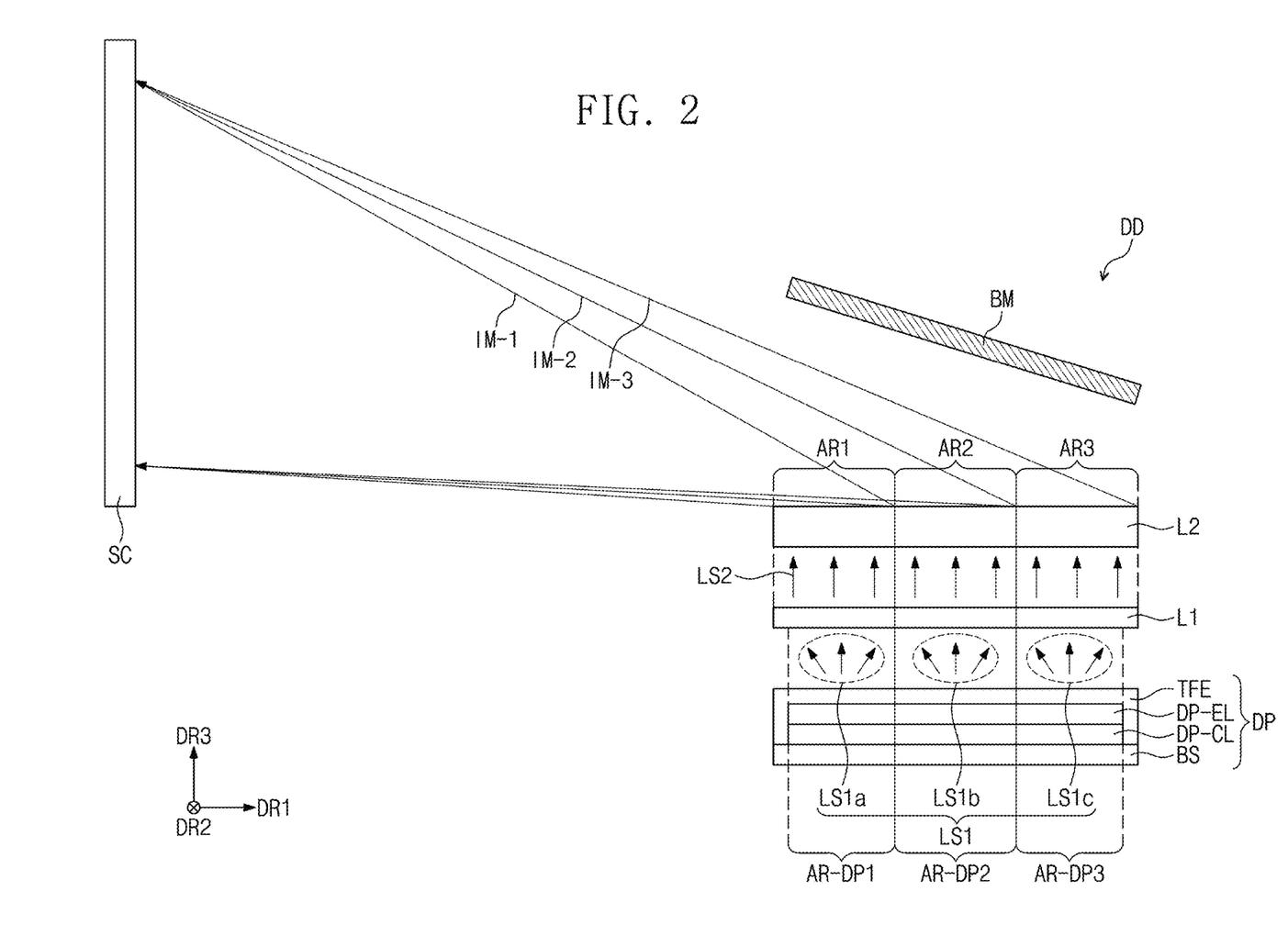
FIG. 2 is a cross-sectional view illustrating the electronic device according to an embodiment of the invention.

FIG. 2 is a cross-sectional view illustrating a portion of the electronic device according to an embodiment of the invention.

Referring to FIG. 2, an embodiment of the display device DD may include a display panel DP, a first optical part L1, a second optical part L2, and a light shielding part BM.

In an embodiment, the display panel DP may be a light emitting display panel or a light receiving display panel, but the embodiment of the invention is not particularly limited thereto. In one alternative embodiment, for example, the light receiving display panel may be a liquid crystal display panel. The light emitting display panel may be an organic light emitting display panel, a micro light emitting diode ("LED") display panel, or a quantum dot light emitting display panel. The organic light emitting display panel may include a light emitting layer containing an organic light emitting material. The quantum dot light emitting display panel may include a light emitting layer containing a quantum dot or a quantum rod. Hereinafter, for convenience of description, embodiments where the display panel DP is an organic light emitting display panel will be described in detail.

An embodiment of the display panel DP may include a base layer BS, a circuit element layer DP-CL, a display element layer DP-EL, and a thin-film encapsulation layer TFE. The display panel DP may emit first light LS1. The first light LS1 may include first display light LS1a, second display light LS1b, and third display light LS1c.

The display panel DP may include a first display area AR-DP1, a second display area AR-DP2, and a third display area AR-DP3.

The first display area AR-DP1 may emit the first display light LS1a to realize a first image IM-1 having a first color. The second display area AR-DP2 may be disposed adjacent to the first display area AR-DP1. The second display area AR-DP2 may emit the second display light LS1b to realize a second image IM-2 having a second color different from the first color. The third display area AR-DP3 may be disposed adjacent to the second display area AR-DP2. The third display area AR-DP3 may emit the third display light LS1c to realize a third image IM-3 having a third color different from the first color and the second color. The second display area AR-DP2 may be disposed between the first display area AR-DP1 and the third display area AR-DP3.

According to an embodiment of the invention, the first image IM-1 may have only the first color, the second image IM-2 may have only the second color, and the third image IM-3 may have only the third color.

The first image IM-1, the second image IM-2, and the third image IM-3 may be images that are different from each other only in color. According to an embodiment of the invention, the display panel DP may provide the first image IM-1, the second image IM-2, and the third image IM-3, each of which has high resolution and high brightness. The first image IM-1, the second image IM-2, and the third image IM-3 may be synthesized or combined and viewed as a single image IM (refer to FIG. 1) on the screen SC. Thus, the electronic device ED (refer to FIG. 1) having improved visibility may be provided.

The first color, the second color, and the third color may have different wavelengths from each other. In one embodiment, for example, the first color may be a red color, the second color may be a green color, and the third color may be a blue color. However, the embodiment of the invention is not limited thereto. In one alternative embodiment, for example, each of the first color, the second color, and the third color may be one of various colors.

The first display area AR-DP1, the second display area AR-DP2, and the third display area AR-DP3 may not overlap each other when viewed on a plane.

The first optical part L1 may be disposed on the display panel DP. The first optical part L1 may be disposed between the display panel DP and the second optical part L2. The first optical part L1 may change a path and a luminance (or intensity) of the first light LS1 provided from the display panel DP. The changed first light LS1 may be second light LS2. The second light LS2 may be parallel light incident in parallel to the second optical part L2. The second light LS2 may travel in a direction parallel to the third direction DR3.

The second optical part L2 may be disposed on the first optical part L1. The second optical part L2 may include a diffraction optical element having a diffraction grating. In an embodiment, the second light LS2 may be incident to the second optical part L2 in a direction parallel to the third direction DR3 to improve a diffraction efficiency. The first image IM-1, the second image IM-2, and the third image IM-3 may be diffracted by the second optical part L2 and provided to the screen SC. A first area AR1, a second area AR2, and a third area AR3 may be defined on the second optical part L2.

The first area AR1 may be disposed on the first display area AR-DP1. The first area AR1 may overlap the first display area AR-DP1 when viewed on a plane. A portion of the second light LS2 realizing or corresponding to the first image IM-1 may be transmitted through the first area AR1.

The second area AR2 may be disposed on the second display area AR-DP2. The second area AR2 may overlap the second display area AR-DP2 on the plane. A portion of the second light LS2 realizing or corresponding to the second image IM-2 may be transmitted through the second area AR2.

The third area AR3 may be disposed on the third display area AR-DP3. The third area AR3 may overlap the third display area AR-DP3 on the plane. A portion of the second light LS2 realizing or corresponding to the third image IM-3 may be transmitted through the third area AR3.

A light shielding part BM may be disposed above the second optical part L2. The light shielding part BM may block the first image IM-1, the second image IM-2, and the third image IM-3, which are not diffracted toward the screen, of the first image IM-1, the second image IM-2, and the third image IM-3, which are diffracted by the second optical part L2.

The screen SC may be spaced apart from the display device DD in the first direction DR1. The first image IM-1, the second image IM-2, and the third image IM-3 may be synthesized or combined at the screen SC and provided as a single image.

Figure 3:
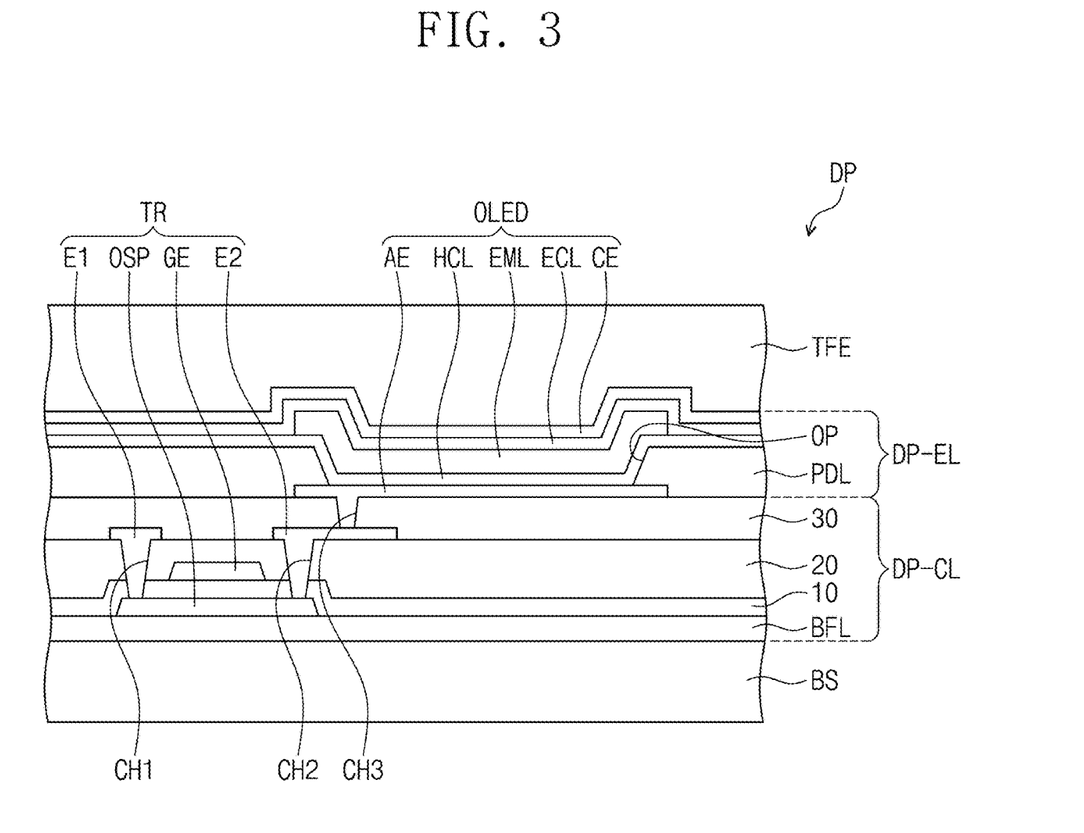
FIG. 3 is a cross-sectional view illustrating a display panel according to an embodiment of the invention.

FIG. 3 is a cross-sectional view illustrating a display panel according to an embodiment of the invention.

Referring to FIG. 3, an embodiment of the display panel DP may include a base layer BS, a circuit element layer DP-CL, a display element layer DP-EL, and a thin-film encapsulation layer TFE.

The base layer BS may include a synthetic resin film. In an embodiment, a synthetic resin layer may be provided on a working substrate that is used when the display panel DP is manufactured. Thereafter, a conductive layer and an insulation layer may be provided on the synthetic resin layer. When the working substrate is removed, the synthetic resin layer may correspond to the base layer BS. The synthetic resin layer may include or contain a thermosetting resin. In an embodiment, the synthetic resin layer may include a polyimide-based resin layer, but the embodiment of the invention is not limited to the material of the synthetic resin layer. Alternatively, the base layer BS may include an organic/inorganic composite substrate.

The circuit element layer DP-CL may include a buffer layer BFL that is an inorganic layer, a first intermediate inorganic layer 10, a second intermediate inorganic layer 20, and an intermediate organic layer 30 that is an organic layer. The embodiment of the invention is not limited to particular material of each of the inorganic layer and the organic layer.

The buffer layer BFL may provide a flat surface on the base layer BS and block impurity elements from being permeated into the base layer BS. In an embodiment of the invention, the buffer layer BFL may be selectively provided or omitted.

A semiconductor pattern OSP of a transistor TR may be disposed on the buffer layer BFL. The semiconductor pattern OSP may include or contain a polysilicon or an amorphous silicon. In an embodiment, the semiconductor pattern OSP may include a metal oxide semiconductor.

The first intermediate inorganic layer 10 may be disposed on the semiconductor pattern OSP. A control electrode GE of the transistor TR may be disposed on the first intermediate inorganic layer 10.

The second intermediate inorganic layer 20 covering the control electrode GE may be disposed on the first intermediate inorganic layer 10. A first electrode E1 and a second electrode E2 of the transistor TR may be disposed on the second intermediate inorganic layer 20.

The first electrode E1 may be may be connected to the semiconductor pattern OSP through a first through-hole CH1 defined through the first intermediate inorganic layer 10 and the second intermediate inorganic layer 20. The second electrode E2 may be connected to the semiconductor pattern OSP through a second through-hole CH2 defined through the first intermediate inorganic layer 10 and the second intermediate inorganic layer 20. In an embodiment of the invention, the transistor TR may be modified to have a bottom gate structure.

The intermediate organic layer 30 covering the first electrode E1 and the second electrode E2 may be disposed on the second intermediate inorganic layer 20. The intermediate organic layer 30 may provide a flat surface.

The display element layer DP-EL may be disposed on the intermediate organic layer 30. The display element layer DP-EL may include a pixel defining layer PDL and a light emitting element OLED. In one embodiment, for example, the light emitting element OLED may include an organic light emitting diode. The pixel defining layer PDL may include an organic material.

A first electrode AE may be disposed on the intermediate organic layer 30. The first electrode AE may be electrically connected to the second electrode E2 through a third through-hole CH3 defined through the intermediate organic layer 30.

An opening OP may be defined in the pixel defining layer PDL. The opening OP of the pixel defining layer PDL may expose at least a portion of the first electrode AE.

A hole control layer HCL may be disposed on the first electrode AE and the pixel defining layer PDL. A light emitting layer EML may be disposed on the hole control layer HCL. The light emitting layer EML may be disposed in an area corresponding to the opening OP. The light emitting layer EML may include an organic material and/or an inorganic material. The light emitting layer EML may emit light having a predetermined color.

An electron control layer ECL may be disposed on the light emitting layer EML. A second electrode CE may be disposed on the electron control layer ECL.

A thin-film encapsulation layer TFE may be disposed on the second electrode CE. The thin-film encapsulation layer TFE may cover the second electrode CE. In an embodiment, a capping layer covering the second electrode CE may be further disposed between the thin-film encapsulation layer TFE and the second electrode CE. In such an embodiment, the thin-film encapsulation layer TFE may directly cover or be disposed directly on the capping layer.

Figure 4:
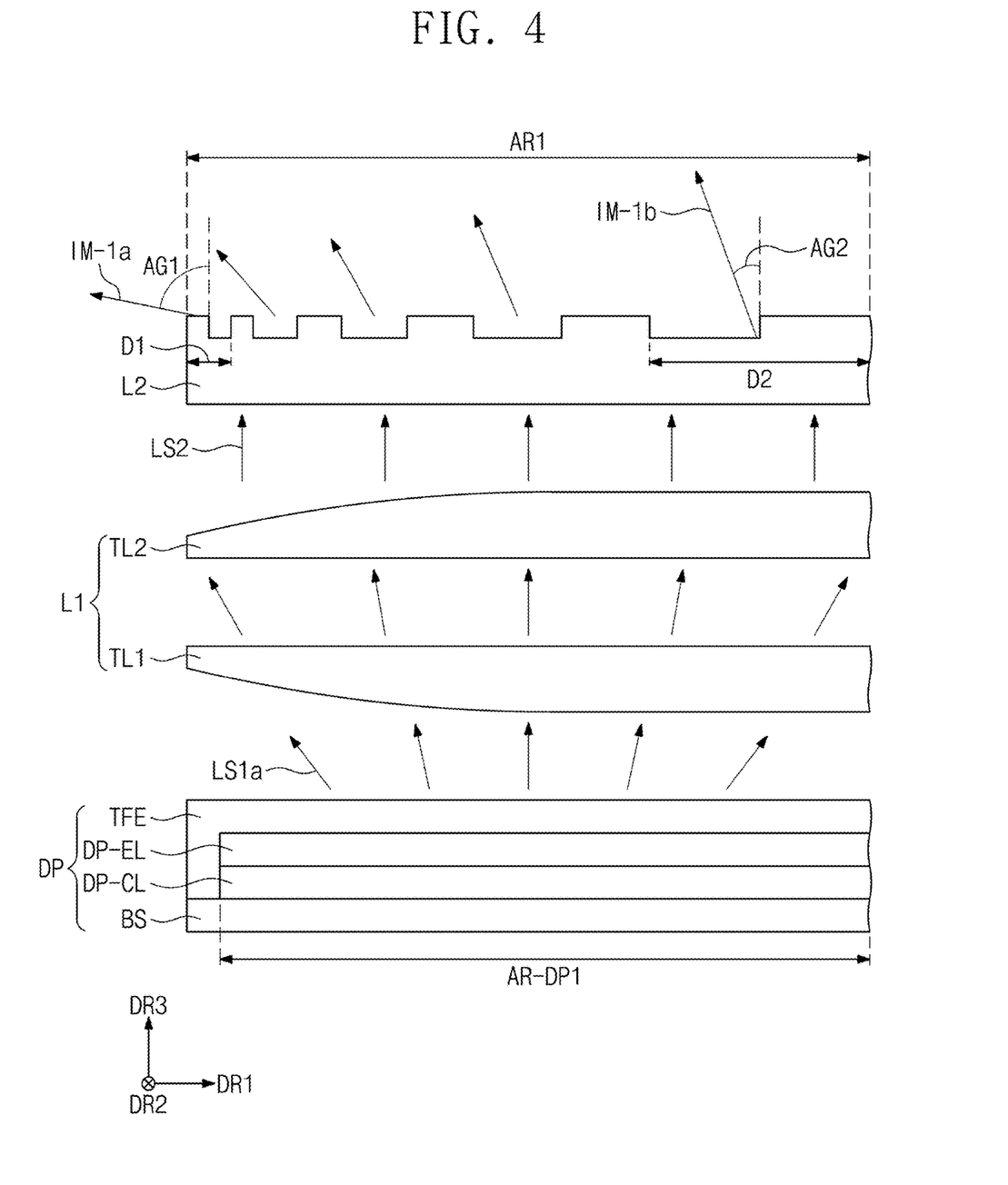
FIG. 4 is a cross-sectional view illustrating a portion of a display device according to an embodiment of the invention.

FIG. 4 is a cross-sectional view illustrating a portion of the display device according to an embodiment of the invention. The same or like elements shown in FIG. 4 have been labeled with the same reference characters as used above to describe the embodiments of the display device shown in FIG. 2, and any repetitive detailed description thereof will hereinafter be omitted or simplified.

Referring to FIGS. 2 and 4, the first display area AR-DP1 of an embodiment of the display panel DP is illustrated in FIG. 4. However, this is merely exemplary. Features of the first display area AR-DP1, which will be described below, may be applied in the same manner to the second display area AR-DP2 and the third display area AR-DP3.

The display panel DP may provide the first display light LS1$a$. The first display light LS1$a$ may be transmitted through the first optical part L1.

The first optical part L1 may include a first lens TL1 and a second lens TL2.

The first lens TL1 may be disposed between the display panel DP and the second optical part L2. The first lens TL1 may disperse the first display light LS1$a$. The first display light LS1$a$ transmitted through the first lens TL1 may be dispersed to have various directionalities. The first lens TL1 may include a concave lens or a convex lens. The first lens TL1 may include a spherical lens or an aspheric lens. However, this is merely exemplary. In an embodiment of the invention, the first lens TL1 may include at least one of various lenses. In one embodiment, for example, the first lens TL1 may include an achromatic lens.

The second lens TL2 may be disposed between the first lens TL1 and the second optical part L2. The second lens TL2 may convert the first display light LS1$a$ transmitted through the first lens TL1 into the second light LS2 having a constant directionality. The second lens TL2 may include a concave lens or a convex lens. The second lens TL2 may include a spherical lens or an aspheric lens. However, this is merely one example. In an embodiment of the invention, the second lens TL2 may include at least one of various lenses. In one embodiment, for example, the second lens TL2 may include an achromatic lens.

However, the embodiment of the invention is not limited to the first optical part L1 described above. In one alternative embodiment, for example, the first optical part L1 may include only one lens or a single lens to convert the first light LS1 into the second light LS2

The second light LS2 may be provided to the second optical part L2 in a direction parallel to the third direction DR3. The second optical part L2 may provide the first image IM-1 to the screen SC by diffracting the second light LS2.

The second optical part L2 may include a diffraction optical element having a diffraction grating. The diffraction grating may have a predetermined pitch. The diffraction grating may have pitches D1 and D2 that are expressed by the following equation: $D*\sin(AG)=m*\lambda$.

The above equation may be a grating equation. The above symbol D denotes the pitches D1 and D2 of the diffraction grating. The above symbol AG denotes an angle between each light IM-1$a$ and IM-1$b$ transmitted through the second optical part L2 and an arbitrary line defined in a thickness direction of the second optical part L2. The light IM-1$a$ and IM-1$b$ may realize the image IM on the screen SC. The thickness direction of the second optical part L2 may be parallel to the third direction DR3. The above symbol m may be an integer, e.g., 1. The above symbol $\lambda$ denotes a wavelength of each of the first color of the first display light LS1$a$, the second color of the second display light LS1$b$, and the third color of the third display light LS1$c$.

Light IM-l$a$ may have a first angle AG1 so that the light IM-1$a$ is projected to a lower portion of the screen SC. A first pitch D1 of the diffraction grating may be designed through or determined based on the above equation.

Light IM-1b may have a second angle AG2 so that the light IM-1b is projected to an upper portion of the screen SC. A second pitch D2 of the diffraction grating may be designed through or determined based on the above equation. In the first area AR1, the pitch of the diffraction grating may gradually increase in the first direction DR1.

The pitch of the diffraction grating may be different in each of the first area AR1 through which the first display light LS1a having the first color is transmitted, the second area AR2 through which the second display light LS1b having the second color is transmitted, and the third area AR3 through which the third display light LS1c having the third color is transmitted.

According to an embodiment of the invention, the electronic device ED may include the first optical part L1 and the second optical part L2. The second optical part L2 may have a reduced size or a thin thickness by using the diffraction optical element. The image IM provided from the display panel DP may pass through the first optical part L1 and the second optical part L2 and be projected to the screen SC. The display device DD may provide the optical part having a reduced size in comparison with a conventional display device having a typical projection method. Thus, the electronic device ED having a reduced size may be provided. Also, a projected direction of the image IM may be adjusted by determining the pitch of the diffraction grating of the second optical part L2 based on the above equation. A focal distance by which the image is provided on the screen SC may be adjusted. Thus, the electronic device ED allowing the image IM to be projected in a close range may be provided.

Figure 5:
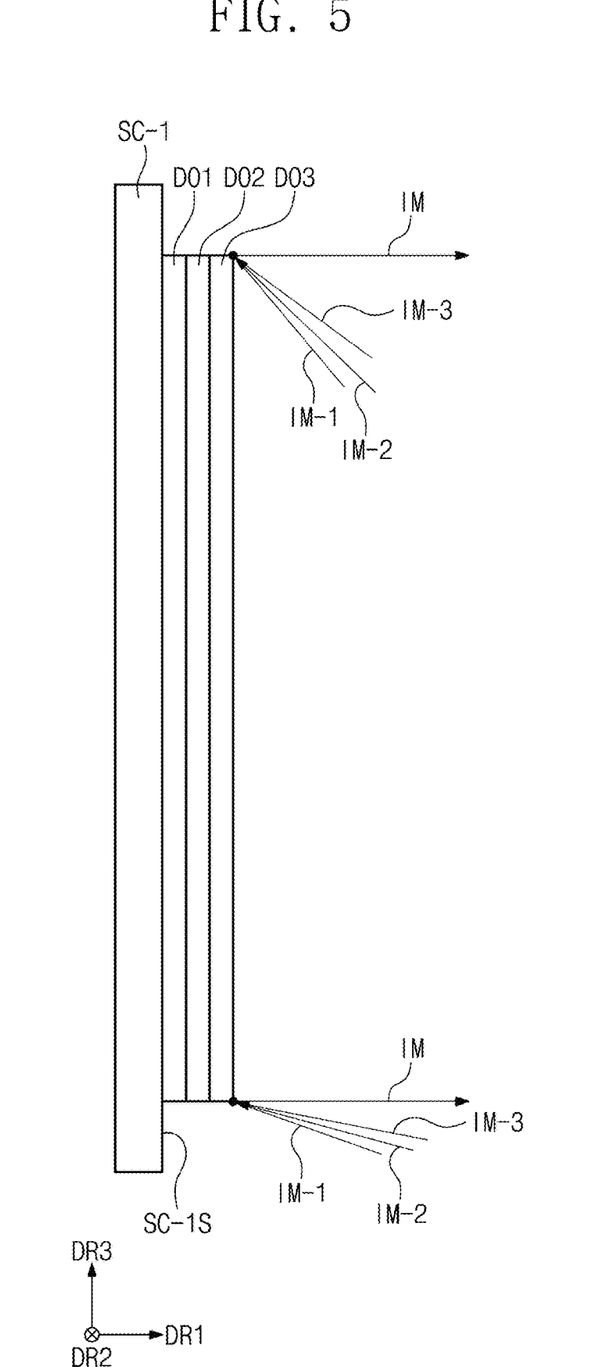
FIG. 5 is a side view illustrating a screen according to an embodiment of the invention.

FIG. 5 is a side view illustrating a screen according to an embodiment of the invention.

Referring to FIGS. 2 and 5, an embodiment of the electronic device ED may further include a first diffraction element DO1, a second diffraction element DO2, and a third diffraction element DO3. The first diffraction element DO1 may be disposed on one surface SC-1S of a screen SC-1. The second diffraction element DO2 may be disposed on the first diffraction element DO1. The third diffraction element DO3 may be disposed on the second diffraction element DO2.

The first diffraction element DO1 may reflect the first image IM-1 having the first color in a predetermined direction. The second diffraction element DO2 may reflect the second image IM-2 having the second color in the predetermined direction. The third diffraction element DO3 may reflect the third image IM-3 having the third color in the predetermined direction. The predetermined direction may be parallel to the first direction DR1. However, this is merely exemplary. The predetermined direction may be variously modified to be in one of various directions in which the image IM is desired to be displayed.

According to an embodiment of the invention, the first image IM-1, the second image IM-2, and the third image IM-3 may be synthesized or combined to provide the image IM. The image IM may be provided in a predetermined direction by the first diffraction element DO1, the second diffraction element DO2, and the third diffraction element DO3. The image IM may have a viewing angle that is restricted in the predetermined direction. Thus, a personal electronic device ED for a single user or viewer may be provided.

Figure 6:
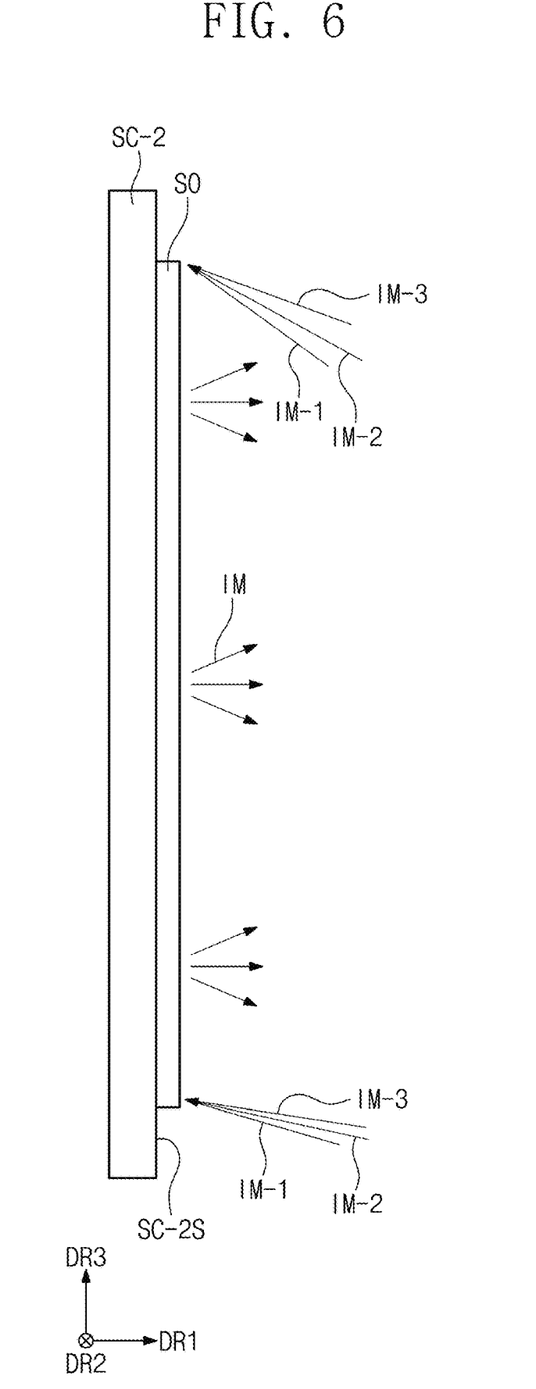
FIG. 6 is a side view illustrating a screen according to an alternative embodiment of the invention.

FIG. 6 is a side view illustrating a screen according to an alternative embodiment of the invention.

Referring to FIGS. 2 and 6, the electronic device ED may further include a scattering element SO. The scattering element SO may be disposed on one surface SC-2S of a screen SC-2.

The first image IM-1, the second image IM-2, and the third image IM-3 may be synthesized or combined at the screen SC-2 to provide the image IM. The image IM may be scattered by the scattering element SO and reflected in all directions.

The screen SC-2 may include a transparent screen or an opaque screen.

According to an embodiment of the invention, the scattering element SO may scatter the image IM. The scattered image IM may be provided in various directions. Thus, a shareable electronic device ED for multiple users or viewers may be provided.

Figure 7:
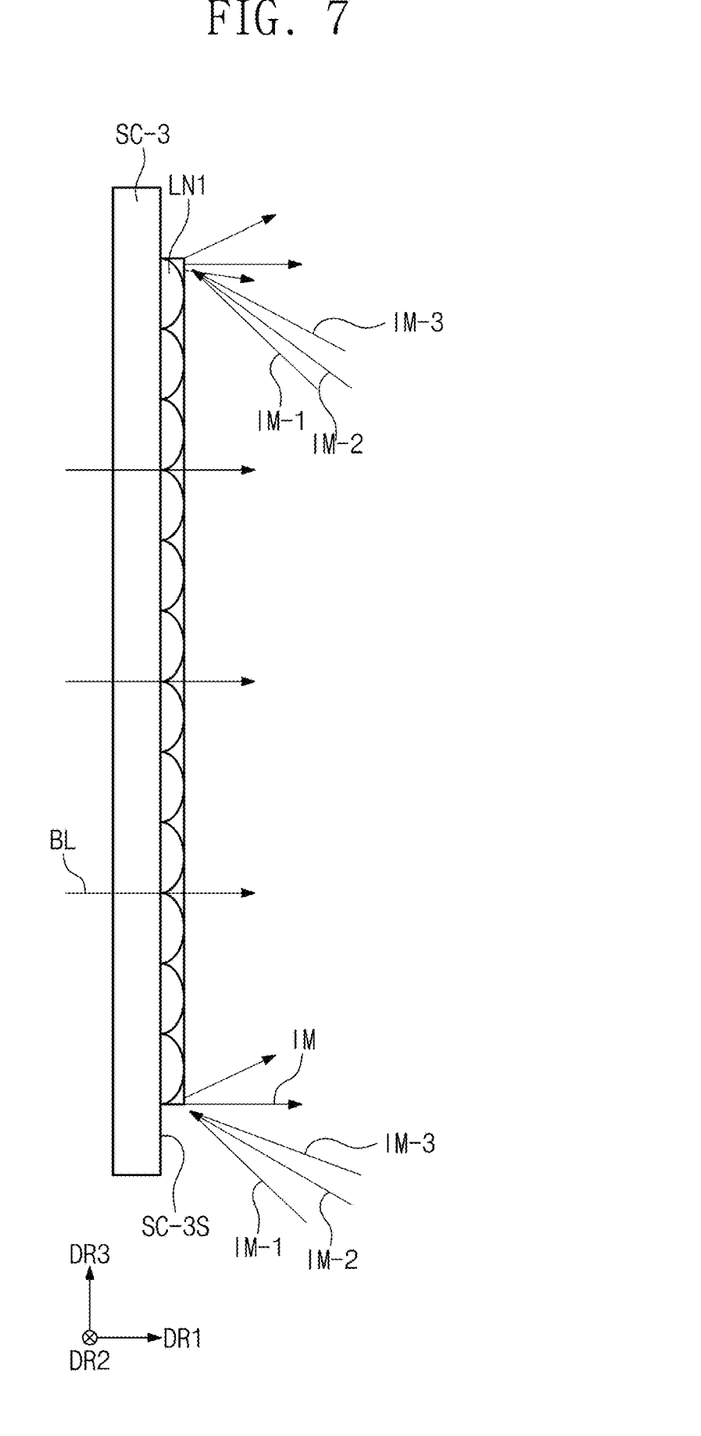
FIG. 7 is a side view illustrating a screen according to another alternative embodiment of the invention.

FIG. 7 is a side view illustrating a screen according to an embodiment of the invention.

Referring to FIGS. 2 and 7, the electronic device ED may further include a first lens part LN1. The first lens part LN1 may be disposed on one surface SC-3S of a screen SC-3.

The screen SC-3 may include a transparent screen. The screen SC-3 may transmit light BL therethrough.

The first lens part LN1 may reflect the first image IM-1, the second image IM-2, and the third image IM-3. The first image IM-1, the second image IM-2, and the third image IM-3, which are reflected, may be synthesized or combined to provide the image IM. The first lens part LN1 may transmit the light BL incident toward the screen SC-3.

According to an embodiment of the invention, the light BL incident toward the screen SC-3 may represent an external environment. The image IM reflected by the first lens part LN1 may be recognized in conjunction with the external environment. Thus, the electronic device ED capable of realizing an augmented reality may be provided.

Figure 8:
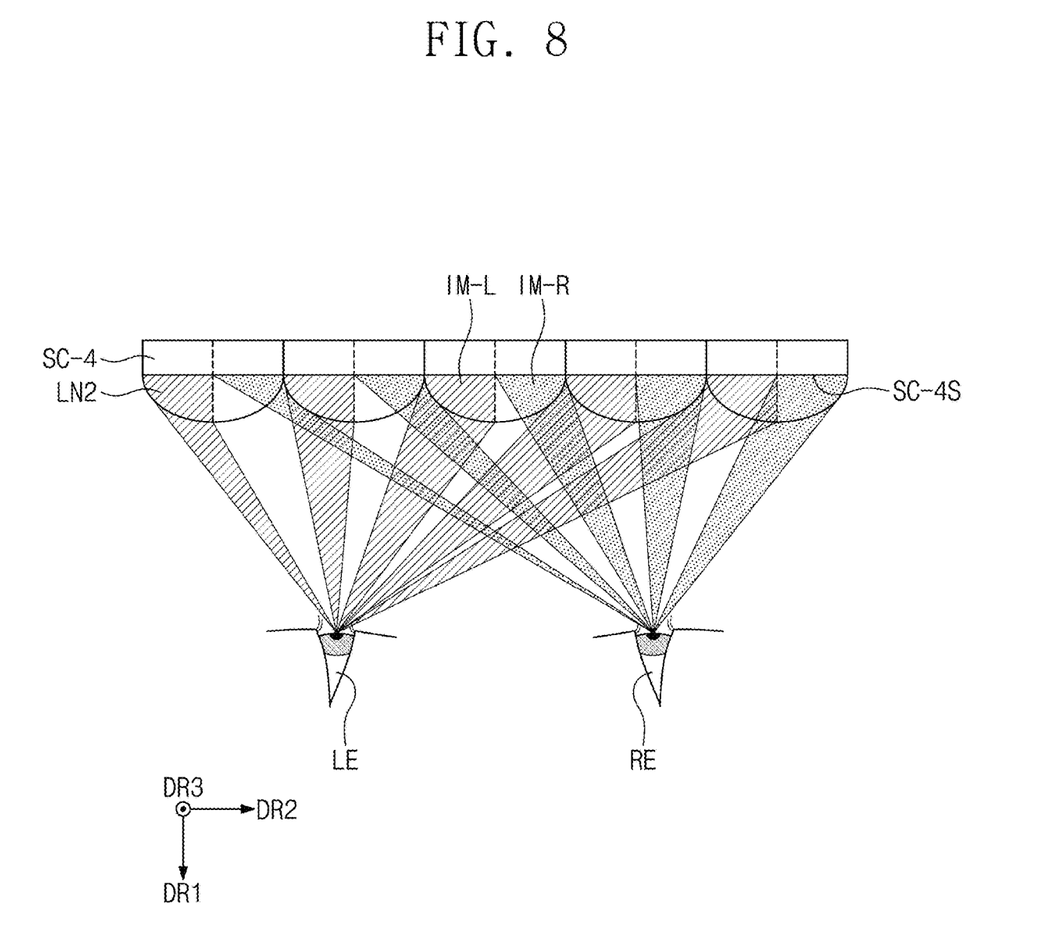
FIG. 8 is a plan view illustrating a screen according to another alternative embodiment of the invention.

FIG. 8 is a plan view illustrating a screen according to an embodiment of the invention.

Referring to FIGS. 2 and 8, the electronic device ED may further include a second lens part LN2. The second lens part LN2 may be disposed on one surface SC-4S of a screen SC-4.

Each of the first image IM-1, the second image IM-2, and the third image IM-3 may include a left eye image and a right eye image. The image IM obtained by synthesizing or combining the first image IM-1, the second image IM-2, and the third image IM-3 may include a left eye image IM-L obtained by synthesizing or combining the left eye images of the first image IM-1, the second image IM-2, and the third image IM-3 and a right eye image IM-R obtained by synthesizing or combining the right eye images of the first image IM-1, the second image IM-2, and the third image IM-3.

The second lens part LN2 may refract the left eye image IM-L in a left eye direction. The left eye direction may be a direction heading toward a left eye LE. The second lens part LN2 may refract the right eye image IM-R in a right eye direction. The right eye direction may be a direction heading toward a right eye RE.

According to an embodiment of the invention, the second lens part LN2 may refract the left eye image IM-L and the right eye image IM-R in different directions from each other. The second lens part LN2 may allow only the left eye image IM-L to be shown in the left eye LE and only the right eye image IM-R to be shown in the right eye RE. The second lens part LN2 may allow different images from each other to be shown in the left eye LE and the right eye RE, respectively, for a three-dimensional effect. The different images from each other may represent images having a binocular parallax. Thus, the electronic device ED capable of regenerating a three-dimensional image may be provided.

According to embodiments of the invention, the electronic device may include the first optical part and the second optical part. The second optical part may have a reduced size by including the diffraction optical element. The image provided from the display panel may be projected to the screen through the first optical part and the second optical part. The display device may provide the optical part having a reduced size in comparison with a conventional projector-type display device. Thus, the electronic device ED having a reduced size may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. An electronic device comprising:
   a display panel including a base layer, a circuit element layer, a display element layer, and a thin-film encapsulation layer;
   a first optical part disposed on the display panel; and
   a second optical part disposed on the first optical part and comprising a diffraction optical element having a diffraction grating,
   wherein the display panel comprises:
      a first display area which emits a first display light corresponding to a first image having a first color;
      a second display area disposed adjacent to the first display area and which emits a second display light corresponding to a second image having a second color different from the first color; and
      a third display area disposed adjacent to the second display area and which emits a third display light corresponding to a third image having a third color different from the first color and the second color, and
   wherein the first display light, the second display light and the third display light are combined with each other by the second optical part.

2. The electronic device of claim 1, wherein
   the second optical part comprises a first area, a second area, and a third area, and
   the first area is disposed on the first display area,
   the second area is disposed on the second display area, and
   the third area is disposed on the third display area.

3. The electronic device of claim 2, wherein the diffraction grating has a pitch which is different in each of the first area, the second area, and the third area.

4. The electronic device of claim 1, wherein the first optical part comprises:
   a first lens disposed between the display panel and the second optical part; and
   a second lens disposed between the first lens and the second optical part.

5. The electronic device of claim 1, wherein the first optical part changes a path and a luminance of light provided from the display panel.

6. The electronic device of claim 1, wherein light incident from the first optical part to the second optical part is parallel light.

7. The electronic device of claim 1, further comprising:
   a light shielding part disposed above the second optical part.

8. The electronic device of claim 1, wherein the first image, the second image and the third image, which are transmitted through the second optical part, are combined into a single image.

9. The electronic device of claim 1, wherein the first display area, the second display area and the third display area do not overlap each other when viewed on a plane.

10. The electronic device of claim 1, wherein
    the first color is a red color,
    the second color is a green color, and
    the third color is a blue color.

11. The electronic device of claim 1, wherein
    the first image has only the first color,
    the second image has only the second color, and
    the third image has only the third color.

12. The electronic device of claim 1, wherein the first image, the second image, and the third image are different from each other only in color.

13. The electronic device of claim 1, further comprising:
    a screen at which the first image, the second image, and the third image are combined into a single image.

14. The electronic device of claim 13, further comprising:
    a first diffraction element disposed on a surface of the screen;
    a second diffraction element disposed on the first diffraction element; and
    a third diffraction element disposed on the second diffraction element.

15. The electronic device of claim 14, wherein
    the first diffraction element reflects the first image in a predetermined direction,
    the second diffraction element reflects the second image in the predetermined direction, and
    the third diffraction element reflects the third image in the predetermined direction.

16. The electronic device of claim 13, further comprising:
    a scattering element disposed on a surface of the screen.

17. The electronic device of claim 13, further comprising:
    a first lens part disposed on a surface of the screen,
    wherein the screen is transparent.

18. The electronic device of claim 17, wherein the first lens part reflects the first image, the second image, and the third image and transmits light incident to the screen.

19. The electronic device of claim 13, further comprising:
    a second lens part disposed on a surface of the screen,
    wherein each of the first image, the second image, and the third image comprises a left eye image and a right eye image, and
    the second lens part refracts each of the left eye image and the right eye image in a predetermined direction to provide a three-dimensional image.

20. The electronic device of claim 13, wherein the screen is opaque.

* * * * *